United States Patent
Kosmowski

(10) Patent No.: US 11,033,982 B2
(45) Date of Patent: Jun. 15, 2021

(54) SYSTEM ISOLATION AND OPTICS BAY SEALING

(71) Applicant: ELECTRO SCIENTIFIC INDUSTRIES, INC., Portland, OR (US)

(72) Inventor: Mark Kosmowski, Portland, OR (US)

(73) Assignee: Electro Scientific Industries, Inc., Beaverton, OR (US)

( * ) Notice: Subject to any disclaimer, the term of this patent is extended or adjusted under 35 U.S.C. 154(b) by 276 days.

(21) Appl. No.: 15/780,072

(22) PCT Filed: Jan. 26, 2017

(86) PCT No.: PCT/US2017/015116
§ 371 (c)(1),
(2) Date: May 30, 2018

(87) PCT Pub. No.: WO2017/132369
PCT Pub. Date: Aug. 3, 2017

(65) Prior Publication Data
US 2018/0369957 A1  Dec. 27, 2018

Related U.S. Application Data

(60) Provisional application No. 62/289,205, filed on Jan. 30, 2016.

(51) Int. Cl.
*B23K 26/08*  (2014.01)
*B23K 26/70*  (2014.01)
(Continued)

(52) U.S. Cl.
CPC .......... *B23K 26/083* (2013.01); *B23K 26/042* (2015.10); *B23K 26/0869* (2013.01);
(Continued)

(58) Field of Classification Search
CPC .. B23K 26/083; B23K 26/042; B23K 26/702; B23K 26/705; B23K 26/0869;
(Continued)

(56) References Cited

U.S. PATENT DOCUMENTS 5,045,635 A * 9/1991 Kaplo ............... H02B 1/16
174/354
7,352,198 B2 * 4/2008 Nayak ................ G01R 31/2891
324/750.22
(Continued)

FOREIGN PATENT DOCUMENTS

JP  2-284788 A  11/1990
JP  2007-158152 A  6/2007

OTHER PUBLICATIONS

PCT/US2017/015116, international search report dated Apr. 28, 2017, 3 pages.
(Continued)

*Primary Examiner* — Phuong T Nguyen
*Assistant Examiner* — Yeong Juen Thong

(57) ABSTRACT

A laser processing system is disclosed, which includes a system frame, a process frame movably supported by the system frame, an optics wall coupled to the process frame, a process shroud coupled to the system frame and extending over and alongside upper and lateral peripheral regions of the optics wall and an optics shroud coupled to the process shroud. The process frame is configured to support a laser source, a workpiece positioning system and a beam delivery system. The process frame is moveable relative to the process shroud and the process frame is moveable relative to the optics shroud. The process shroud, the optics wall and the process frame enclose a first space for laser processing
(Continued)

of a workpiece. The optics shroud, the optics wall and the process frame enclose a second space for accommodating the laser source.

13 Claims, 2 Drawing Sheets

(51) Int. Cl.
*B23K 26/042* (2014.01)
*B23K 101/36* (2006.01)
*G01R 31/28* (2006.01)
(52) U.S. Cl.
CPC .......... *B23K 26/702* (2015.10); *B23K 26/705* (2015.10); *G01R 31/2891* (2013.01); *B23K 2101/36* (2018.08)
(58) Field of Classification Search
CPC ............ B23K 2101/36; G01R 31/2891; B29C 35/08; B29C 64/135; B29C 64/255; B33Y 10/00; B33Y 30/00

USPC ........... 219/121, 121.67; 264/401, 40.1, 308, 264/316, 337
See application file for complete search history.

(56) References Cited

U.S. PATENT DOCUMENTS

| 8,372,330 | B2* | 2/2013 | El-Siblani | B33Y 10/00 |
| | | | | 264/401 |
| 2003/0052105 | A1* | 3/2003 | Nagano | B23K 26/0604 |
| | | | | 219/121.83 |
| 2007/0096763 | A1 | 5/2007 | Ehrmann et al. | |
| 2009/0121156 | A1* | 5/2009 | Mahoney | C23C 14/022 |
| | | | | 250/492.2 |
| 2011/0240402 | A1 | 10/2011 | Chou et al. | |
| 2011/0259862 | A1 | 10/2011 | Scott et al. | |
| 2014/0286363 | A1 | 9/2014 | Kasai | |

OTHER PUBLICATIONS

PCT/US2017/015116, written opinion, 5 pages.
Office action dated Feb. 24, 2021 to Japanese Patent Application No. 2018-532432.

* cited by examiner

SYSTEM ISOLATION AND OPTICS BAY SEALING

CROSS-REFERENCE TO RELATED APPLICATIONS

This application claims the benefit of U.S. Provisional Application No. 62/289,205, filed Jan. 30, 2016, which is incorporated by reference in its entirety.

BACKGROUND

I. Technical Field

Embodiments disclosed herein relate generally to laser processing systems and, more particularly, to arrangements for providing vibrational isolation and environmental sealing.

II. Discussion of the Related Art

Laser processing systems commonly include components such as a laser source, laser optics for conditioning (e.g., expanding, collimating, filtering, polarizing, focusing, attenuating, reflecting, etc.) laser energy generated by the laser source, a beam delivery system for guiding the conditioned laser energy to the workpiece and a workpiece positioning system for moving or otherwise positioning the workpiece within the laser processing system. A workpiece positioning system typically includes one or more motion stages (e.g., linear stages, rotary stages, or the like or any combination thereof), to move the workpiece within the laser processing system. The beam delivery system may include a scan lens, a beam positioning system (e.g., one or more galvo-driven mirrors, one or more fast-steering mirrors, etc.), or the like or any combination thereof. Laser processing systems may sometimes include a gantry for supporting one or more components of the beam delivery system (e.g., a scan lens, one or more galvo-driven mirrors, one or more fast-steering mirrors, etc.) over the workpiece. When a gantry is included, the beam delivery system may further include one or more motion stages (e.g., linear stages, rotary stages, or the like or any combination thereof), to move the scan lens, one or more galvo-driven mirrors, one or more fast-steering mirrors, etc., relative to the gantry.

Insofar as any of the aforementioned components affect the ability of the laser processing system to accurately and reliably deliver laser energy to a particular location (or to within a range of a particular location) on or within the workpiece, such components are generically referred to herein as "process components." To ensure accurate and reliable laser processing, it is generally desirable to at least partially isolate the process components from external vibrations (i.e., vibrations present in the environment surrounding the laser processing system). Examples of external vibrations include vibrations transmitted by a floor supporting the laser processing system or other structure(s) contacting an exterior of the laser processing system. One conventional method of isolating process components involves coupling the process components to a common frame (also referred to herein as a "process frame") and mounting the process frame on a vibration isolation base (also referred to herein as a "process base"), typically provided as a relatively heavy block of granite, diabase, or the like. The process base is typically seated within a system frame, and rests on a set of mounts made from an elastomer material. Despite using this vibration isolation scheme, the process components can still oscillate at a low frequency (e.g., 3 Hz to 12 Hz) when one or more stages (e.g., in the workpiece positioning system, in the beam delivery system, etc.) accelerate, decelerate, or otherwise move relative to the system frame.

The laser source and some or all of the laser optics are typically housed within a cabinet-style shroud (i.e., an "optics shroud") that is fixedly coupled to the process frame (e.g., so that relative positions of the optics shroud and the process frame can remain fixed, or at least substantially fixed). The space enclosed by the optics shroud can also be positively pressurized to prevent particulate matter (e.g., vapors, debris, etc., generated during laser processing of the workpiece) from accumulating on optical surfaces of the laser source and laser optics. Likewise, the beam delivery system and the workpiece positioning system are housed within a cabinet-style shroud (i.e., a "process shroud") that is fixedly coupled to the process frame (e.g., so that relative positions of the process shroud and the process frame can remain fixed, or at least substantially fixed). Thus, when fixedly coupled to the process frame, the optics shroud and the process shroud experience no (or substantially no) movement relative to one another. The process shroud can be sealed to prevent or minimize the diffusion of particulate matter generated during laser processing of the workpiece, which can be potentially hazardous to human health, into the external environment surrounding the laser processing system.

If the process base or process shroud are left exposed to the external environment, it is possible that alignment between the process components can be degraded (e.g., in the event that the process base, optics shroud or process shroud are impacted or pushed by some external force). To mitigate the potentially-deleterious effects from such an external force, a system shroud (e.g., formed of sheet metal) is often provided to enclose both the optics shroud and the process shroud. The system shroud is fixedly coupled to the system frame (e.g., so that relative positions of the system shroud and the system frame can remain fixed, or at least substantially fixed). However, because the process base is moveable relative to the system frame, the system shroud can nevertheless move relative to the optics shroud and the process shroud if the system shroud is impacted by an external force. Likewise, the optics shroud and the process shroud can move relative to the system shroud when one or more motion stages accelerate, decelerate, or otherwise move relative to the system frame, etc. As with the process shroud, the system shroud can be sealed to prevent or minimize the diffusion of particulate matter generated during laser processing of the workpiece into the external environment surrounding the laser processing system. While conventional system shrouds, such as those described above, are useful, they is also relatively expensive components of laser processing systems.

SUMMARY

One embodiment of the invention can be characterized as a laser processing system that includes a system frame, a process frame that is supported by, and moveable relative to, the system frame, wherein the process frame is configured to support a laser source, a workpiece positioning system and a beam delivery system; an optics wall coupled to the process frame; a process shroud coupled to the system frame and extending over and alongside upper and lateral peripheral regions of the optics wall, wherein the process shroud, the optics wall and the process frame enclose a first space for laser processing of a workpiece and wherein the process frame is moveable relative to the process shroud; and an optics shroud coupled to the process shroud, wherein the optics shroud, the optics wall and the process frame enclose a second space for accommodating the laser source and wherein the process frame is moveable relative to the optics shroud.

Another embodiment of the invention can be characterized as a laser processing system that includes a system frame; an optics bay supported by the system frame and partially defined by an optics shroud, wherein the optics bay is configured to house a laser source; and a process bay supported by the system frame and partially defined by a process shroud, wherein the process bay is in optical communication with the optics bay and is configured to house a beam delivery system and a workpiece positioning system, wherein each of the optics shroud and the process shroud partially define an exterior surface of the laser processing system.

DETAILED DESCRIPTION

Figure 1:
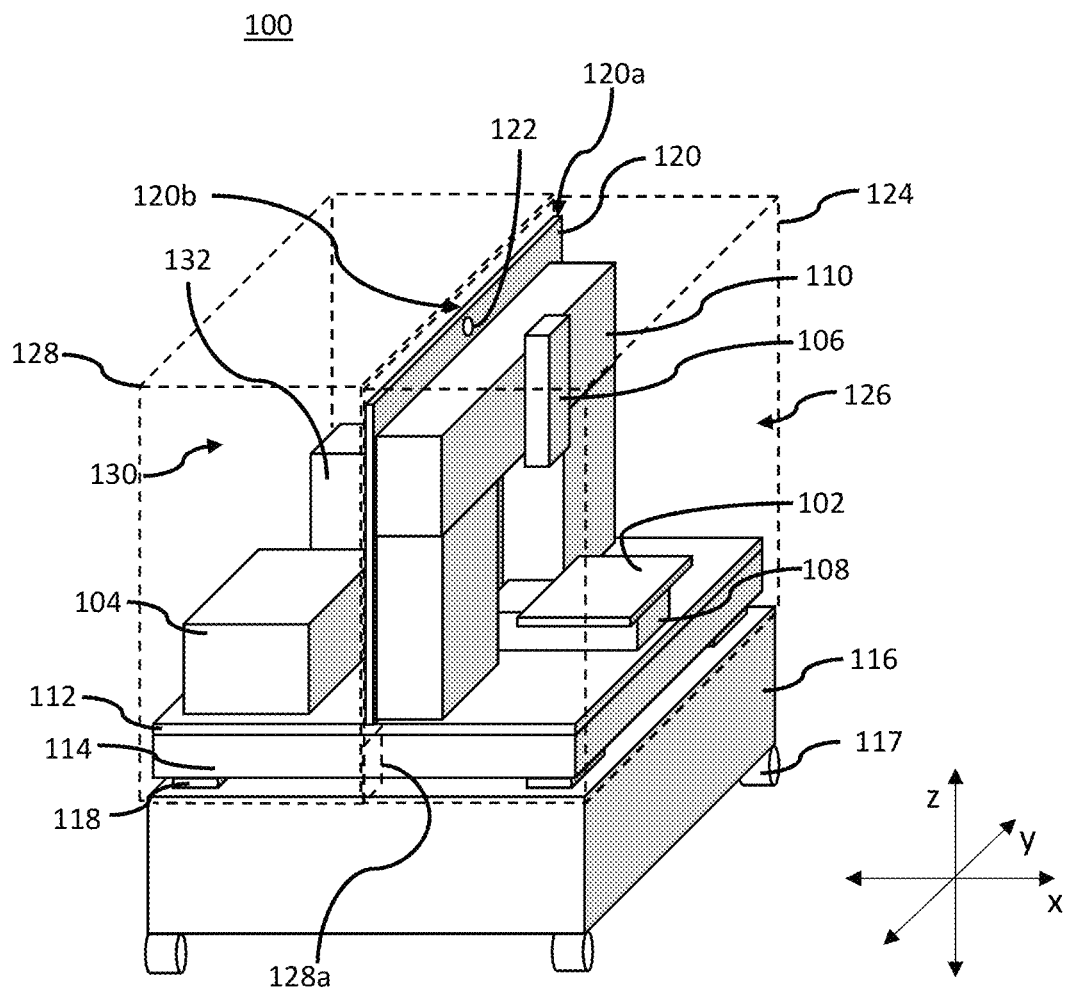
FIG. 1 is a perspective view schematically illustrating a laser processing system according an embodiment of the present invention.

Example embodiments are described herein with reference to the accompanying FIGS. Unless otherwise expressly stated, in the drawings the sizes, positions, etc., of components, features, elements, etc., as well as any distances therebetween, are not necessarily to scale, but are exaggerated for clarity.

The terminology used herein is for the purpose of describing particular example embodiments only and is not intended to be limiting. As used herein, the singular forms "a," "an" and "the" are intended to include the plural forms as well, unless the context clearly indicates otherwise. It should be recognized that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise specified, a range of values, when recited, includes both the upper and lower limits of the range, as well as any sub-ranges therebetween. Unless indicated otherwise, terms such as "first," "second," etc., are only used to distinguish one element from another. For example, one node could be termed a "first node" and similarly, another node could be termed a "second node", or vice versa. The section headings used herein are for organizational purposes only and are not to be construed as limiting the subject matter described.

Unless indicated otherwise, the term "about," "thereabout," etc., means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

Spatially relative terms, such as "below," "beneath," "lower," "above," and "upper," and the like, may be used herein for ease of description to describe one element or feature's relationship to another element or feature, as illustrated in the FIGS. It should be recognized that the spatially relative terms are intended to encompass different orientations in addition to the orientation depicted in the FIGS. For example, if an object in the FIGS. is turned over, elements described as "below" or "beneath" other elements or features would then be oriented "above" the other elements or features. Thus, the exemplary term "below" can encompass both an orientation of above and below. An object may be otherwise oriented (e.g., rotated 90 degrees or at other orientations) and the spatially relative descriptors used herein may be interpreted accordingly.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

It will be appreciated that many different forms and embodiments are possible without deviating from the spirit and teachings of this disclosure and so this disclosure should not be construed as limited to the example embodiments set forth herein. Rather, these examples and embodiments are provided so that this disclosure will be thorough and complete, and will convey the scope of the disclosure to those skilled in the art.

Referring to FIG. 1, a laser processing system 100 configured to process a workpiece (not shown), which can be fixed, held, retained or otherwise supported by a chuck or fixture 102, may include components such as a laser source 104 for generating laser energy (e.g., manifested as one or more laser pulses, as a continuous beam of laser energy, or a combination thereof), laser optics (optional, and not shown) for conditioning (e.g., expanding, collimating, filtering, polarizing, focusing, attenuating, reflecting, etc.) laser energy generated by the laser source 104, a beam delivery system 106 for guiding the (optionally, conditioned) laser energy to the workpiece, and a workpiece positioning system 108 for moving or otherwise positioning the fixture 102 within the laser processing system 100.

The workpiece positioning system 108 can include one or more motion stages (e.g., linear stages, rotary stages, or the like or any combination thereof), to move the fixture 102 within the laser processing system 100. For example, the workpiece positioning system 108 may include one or more motion stages to move the fixture 102 along the X-axis, along the Y-axis, along the Z-axis, about the X-axis, about the Y-axis, about the Z-axis, or the like or any combination thereof.

The beam delivery system 106 may include a scan lens, a beam positioning system (e.g., one or more galvo-driven mirrors, one or more fast-steering mirrors, etc.), or the like or any combination thereof. In the illustrated embodiment, the processing system 100 includes a gantry 110 for supporting one or more components of the beam delivery system 106 (e.g., a scan lens, one or more galvo-driven mirrors, one or more fast-steering mirrors, etc.) over the fixture 102. Although not shown, the beam delivery system 106 may further include one or more motion stages (e.g., linear stages, rotary stages, or the like or any combination thereof), to move the scan lens, one or more galvo-driven mirrors, one or more fast-steering mirrors, etc., relative to the gantry 110 (e.g., along the X-axis, along the Y-axis, along the Z-axis, about the X-axis, about the Y-axis, about the Z-axis, or the like or any combination thereof).

Insofar as any of the aforementioned components affect the ability of the laser processing system 100 to accurately and reliably deliver laser energy to a particular location (or to within a vicinity of a particular location) on or within the workpiece, such components are generically referred to herein as "process components." To ensure accurate and reliable laser processing, the process components are at least partly isolated from external vibrations, the process components are coupled to common frame (also referred to herein as a "process frame") 112 which, in turn, is mounted on a vibration isolation base (also referred to herein as a "process base") 114 (e.g., a relatively heavy block of granite, diabase, or the like or any combination thereof). The process base 114 is seated on or within a system frame 116, and rests on a set of mounts 118 (e.g., made from an elastomer material). The system frame 116 may be optionally supported (e.g., on a floor) by one or more supports such as industrial castors 117. Despite using this vibration isolation scheme, the process components can still oscillate at a low frequency (e.g., 3 Hz to 12 Hz) when one or more motion stages (e.g., in the workpiece positioning system 108, in the beam delivery system 106, etc.) accelerate, decelerate, or otherwise move relative to the system frame 116. This oscillation can result in motion of the process frame 112 and process base 114 (relative to the system frame 116) of about 4 to 8 mm in amplitude.

The laser processing system 100 further includes an optics wall 120 coupled to the process frame 112. For example, the optics wall 120 is fixedly coupled to the process frame 112 so that relative positions of the optics wall and the process frame 112 can remain fixed, or at least substantially fixed during laser processing of a workpiece. In the illustrated embodiment, the optics wall 120 extends between components such as the laser source 104 and components such as the gantry 110. The optics wall 120 may be provided as a solid wall, but may include an opening or port (e.g., beam port 122) extending therethrough, to permit laser energy generated by the laser source 104 (and, optionally, conditioned by the laser optics) to be transmitted to the beam delivery system 106 (e.g., via a free-space beam transmission system including one or more lenses, mirrors, etc., via a non-free-space beam transmission system such as an fiber optic beam delivery system including one or more optical fibers, input/output coupling optics, fiber end connections, etc., or the like or any combination thereof), as is known in the art.

The laser processing system 100 may include a cabinet-style shroud (i.e., a "process shroud"), shown in FIG. 1 at 124, which is coupled to the system frame 116, and is closely adjacent to (but spaced apart from) the optics wall 120, to define a process bay 126. In one embodiment, the process shroud 124 is fixedly coupled to the system frame 116 so that relative positions of the process shroud 124 and the system frame 116 can remain fixed, or at least substantially fixed, during laser processing of a workpiece. However, because the process frame 112 can move relative to the system frame 116, and due to the presence of the gap between the process shroud 124 and the optics side 120b of the optics wall 120, relative positions of the process shroud 124 and the process frame 112 can change during laser processing of a workpiece. Unlike conventional laser processing systems, the process shroud 124 defines a portion of the exterior of the laser process system 100. Accordingly, in one embodiment, the process shroud 124 is tightly coupled to the system frame 116 (or is otherwise equipped with one or more seals or is otherwise suitably configured) to prevent (or at least substantially prevent) particulate matter generated during laser processing of the workpiece from exiting the process bay 126 between the process shroud 124 and the system frame 116.

Figure 2:
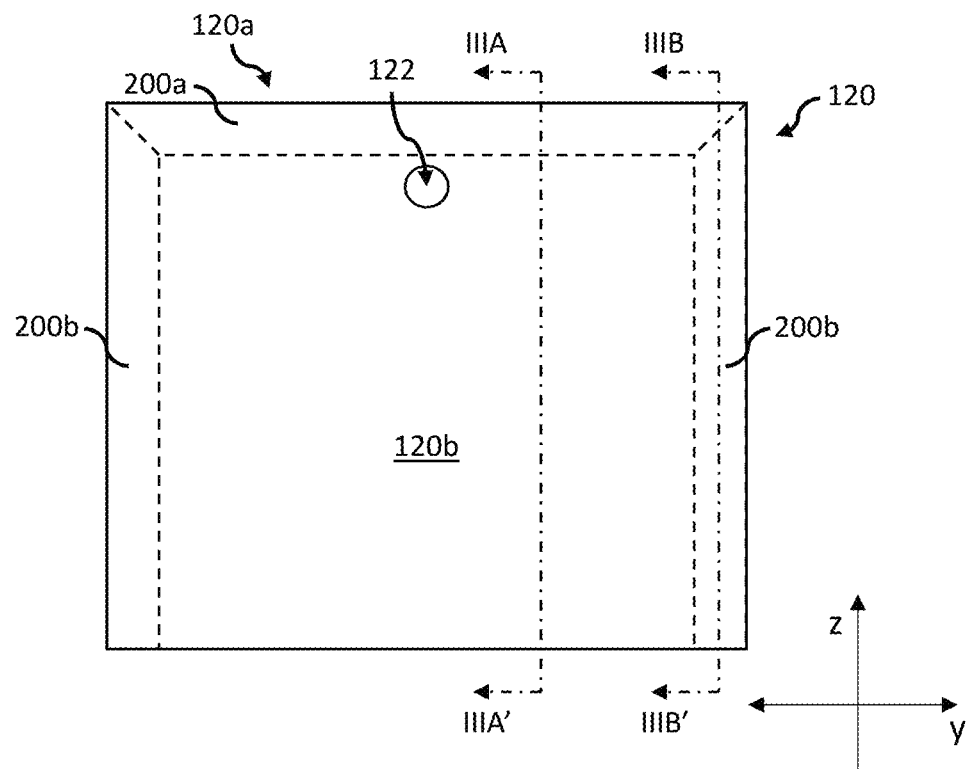
FIG. 2 is a plan view schematically illustrating an optics side of the optics wall shown in FIG. 1.

The process shroud 124 extends over a top portion of the optics wall 120a, and down alongside upper and lateral peripheral regions of a side of the optics wall 120 that face toward the laser source 104 (herein referred to as the "optics side" 120b of the optics wall 120). See, e.g., FIG. 2, in which the upper peripheral region of the optics side 120b of optics wall 120 region is identified at 200a, and the lateral peripheral regions of the optics side 120b of optics wall 120 region are identified at 200b. Further, the process shroud 124 is spaced apart from the optics wall 120, thereby defining a gap between the process shroud 124 and the optics side 120b of the optics wall 120. Thus, referring back to FIG. 1, a portion of the process shroud 124 is interposed between the laser source 104 and the optics wall 120. The chuck or fixture 102 (and any workpiece held thereto), the beam delivery system 106 and the workpiece positioning system 108 may thus be enclosed within the process bay 126.

Figures 3A, 3B:
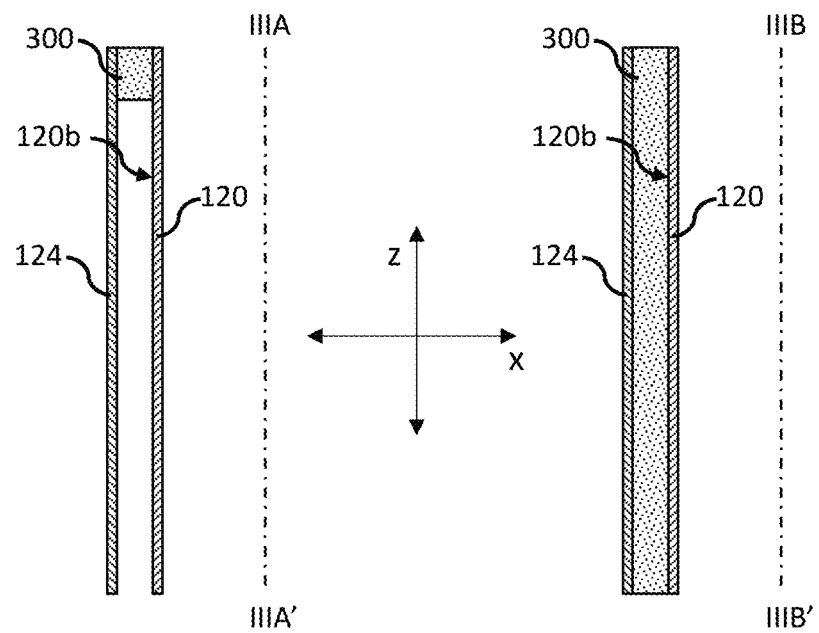
FIGS. 3A and 3B are cross-sectional views, taken along lines IIIA-IIIA' and IIIB-IIIB' shown in FIG. 2, respectively, schematically illustrating exemplary arrangements of compliant sealing material provided between the process shroud and the optics wall shown in FIG. 1.

In one embodiment, a compliant sealing material, such as foam, is disposed within the gap between the optics wall 120 and the process shroud 124. For example, and with reference to FIGS. 3A and 3B, compliant sealing material 300 may be provided to fill the space between the upper peripheral region 200a of the optics side 120b of the optics wall 120 and the process shroud 124 (see, e.g., FIG. 3A) and compliant sealing material 300 may also be provided to fill the space between the lateral peripheral regions 200b of the optics side 120b of the optics wall 120 and the process shroud 124 (see, e.g., FIG. 3B). The compliant sealing material 300 may be adhered to the optics side 120b of the optics wall 120. The compliant sealing material 300 is configured to prevent (or at least reduce the likelihood of) particulate matter generated during laser processing of the workpiece from exiting the process bay 126 between the optics wall 120 and the process shroud 124. The thickness of the compliant sealing material 300 is selected such that it is compressed when the process shroud 124 is coupled to the system frame 116 as discussed above. For example, the compliant sealing material 300 may have a thickness of 13 mm (or thereabout, e.g., 12.7 mm) when uncompressed. When the process shroud 124 is coupled to the system frame 116, the compliant sealing material may be compressed by about 4 mm to 5 mm, thus leaving up to about ±4 mm of available motion between the process frame 112 (and process base 114) relative to the system frame 116 and process shroud 124. That is, when the compliant sealing material 300 is compressed as discussed above, the process frame 112 (and process base 114) can move, relative to the system frame 116 or the process shroud 124, by a distance of up to 4 mm (or thereabout).

Referring back to FIG. 1, the laser processing system 100 may include a cabinet-style shroud (i.e., an "optics shroud") 128, which is coupled to the process shroud 124. For example, the optics shroud 128 is fixedly coupled to the process shroud 124 so that relative positions of the optics shroud 128 and the process shroud 124 can remain fixed, or at least substantially fixed during laser processing of a workpiece. The optics shroud 128 is closely adjacent to (but spaced apart from) the process frame 112, the process base 114 and the system frame 116, thereby defining gaps between the optics shroud 128 and various structures such as the process frame 112, the process base 114 and the system frame 116, and to thereby define an optics bay 130. The laser source 104 and some or all of the laser optics may be enclosed within the optics bay 130. Optionally, the optics shroud 128 is fixedly coupled to the process frame 116 (e.g., using one or more screws, rivets, bolts, clamps, etc.). Unlike conventional laser processing systems, the optics shroud 128 defines a portion of the exterior of the laser process system 100.

The laser processing system 100 can also include a pump (e.g., pump 132, in fluid communication with the environment external to the laser processing system, with a source of pressurized purge gas, etc.) disposed within the optics bay 130 to positively pressurize optics bay 130 (e.g., so as to prevent particulate matter such as vapors, debris, etc., generated during laser processing of the workpiece from accumulating on optical surfaces of the laser source 104 and laser optics). In one embodiment, the optics shroud 128 is tightly coupled to the process shroud 124 (or is otherwise equipped with one or more seals or is otherwise suitably configured) to prevent (or at least substantially prevent) gas from escaping from the optics bay 130 into the environment external to the laser processing apparatus 100. In this case, a portion of the process shroud 124 is located between the optics shroud 128 and the aforementioned compliant sealing material 300 (i.e., wherein the compliant sealing material 300 is located between the process shroud 124 and the optics wall 120, as discussed above).

Although not shown, compliant sealing material, such as foam, may be disposed within the gaps between the optics shroud 128 and one or more (or all) structures such as the process frame 112, the process base 114 and the system frame 116. For example, compliant sealing material may be provided to fill the space between the optics shroud 128 and one or more (or all) structures such as the process frame 112, the process base 114 and the system frame 116. The compliant sealing material may be adhered to the optics shroud 128, the process frame 112, the process base 114, the system frame 116 or any combination thereof. The compliant sealing material is configured to prevent (or at least reduce the likelihood of) gas pumped into the optics bay 130 from entering into the external environment surrounding the laser processing system 100. The thickness of the compliant sealing material is selected such that it is compressed when the optics shroud 128 is coupled to the process shroud 124 as discussed above. For example, the compliant sealing material may have a thickness of 13 mm (or thereabout, e.g., 12.7 mm) when uncompressed. When the optics shroud 128 is coupled to the process shroud 124 (and when the process shroud 124 is, in turn, coupled to the system frame 116), the compliant sealing material adhered to the optics shroud 128 may be compressed by about 4 mm to 5 mm, thus leaving up to about ±4 mm of available motion between the process frame 112 relative to the system frame 116 and optics shroud 128. That is, when the compliant sealing material is compressed as discussed above, the process frame 112 can move, relative to the system frame 116 or the optics shroud 128, by a distance of up to 4 mm (or thereabout).

Optionally, at least one of the process shroud 124 and the optics shroud 128 further includes at least one flange, such as flange 128a, arranged at a lower portion thereof, near a lateral peripheral region 200b of the optics wall 120. In one embodiment, a set of two such flanges 128a is included, wherein the flanges 128a are arranged at opposite lateral peripheral regions 200b of the optics wall 120. Each flange 128a extends toward at least one of the process frame 112, the process base 114 and the system frame 116. If the flange 128a extends from the process shroud 124, compliant sealing material (not shown), such as foam, may be disposed between the flange 128a and the optics shroud 128. Likewise, if the flange 128a extends from the optics shroud 128, compliant sealing material (not shown), such as foam, may be disposed between the flange 128a and the process shroud 124. The compliant sealing material is configured to prevent (or at least substantially prevent) particulate matter generated during laser processing of the workpiece from exiting the process bay 126.

The foregoing is illustrative of embodiments and examples of the invention, and is not to be construed as limiting thereof. Although a few specific embodiments and examples have been described with reference to the drawings, those skilled in the art will readily appreciate that many modifications to the disclosed embodiments and examples, as well as other embodiments, are possible without materially departing from the novel teachings and advantages of the invention. Accordingly, all such modifications are intended to be included within the scope of the invention as defined in the claims. For example, skilled persons will appreciate that the subject matter of any sentence, paragraph, example or embodiment can be combined with subject matter of some or all of the other sentences, paragraphs, examples or embodiments, except where such combinations are mutually exclusive. The scope of the present invention should, therefore, be determined by the following claims, with equivalents of the claims to be included therein.

What is claimed is:

1. A laser processing system, comprising:
    a system frame;
    a process frame supported by, and moveable relative to, the system frame, wherein the process frame is configured to support a laser source, a workpiece positioning system and a beam delivery system;
    an optics wall coupled to the process frame;
    a process shroud coupled to the system frame and extending over and alongside upper and lateral peripheral regions of the optics wall, wherein the process shroud, the optics wall and the process frame enclose a first space for laser processing of a workpiece and wherein the process frame is moveable relative to the process shroud; and
    an optics shroud coupled to the process shroud, wherein the optics shroud, the optics wall and the process frame enclose a second space for accommodating the laser source and wherein the process frame is moveable relative to the optics shroud;
    a compliant sealing material disposed between the process shroud and the optics wall; and
    a pump arranged within the second space, wherein the pump is configured to positively pressurize the second space,
    wherein the beam delivery system is arranged within the first space.

2. The laser processing system of claim 1, further comprising compliant sealing material disposed between the optics shroud and at least one selected from the group consisting of the process frame and the system frame.

3. The laser processing system of claim 1, further comprising:
    a process base supporting the process frame; and
    a mount supporting the process base on the system frame.

4. The laser processing system of claim 3, wherein the process base includes a block of granite.

5. The laser processing system of claim 3, wherein the mount includes an elastomeric material.

6. The laser processing system of claim 1, wherein the optics wall includes a beam port defined therein, wherein the beam port is configured to transmit laser energy generatable by the laser source.

7. The laser processing system of claim 1, further comprising the laser source, wherein the laser source is mounted on the process frame.

8. The laser processing system of claim 1, further comprising the laser source, wherein the laser source is arranged within the second space.

9. The laser processing system of claim 1, further comprising the workpiece positioning system, wherein the workpiece positioning system is mounted on the process frame and is arranged within the first space.

10. The laser processing system of claim 1, further comprising a gantry mounted on the process frame and arranged within the first space.

11. The laser processing system of claim 10, further comprising the beam delivery system, wherein the beam delivery system is mounted to the gantry.

12. The laser processing system of claim 1, wherein the process frame is moveable relative to the process shroud when the first space is enclosed by the process shroud, the optics wall and the process frame.

13. The laser processing system of claim 1, wherein the process frame is moveable relative to the optics shroud when the second space is enclosed by the optics shroud, the optics wall and the process frame.

* * * * *